(12) United States Patent
Canaperi et al.

(10) Patent No.: US 6,524,935 B1
(45) Date of Patent: Feb. 25, 2003

(54) PREPARATION OF STRAINED SI/SIGE ON INSULATOR BY HYDROGEN INDUCED LAYER TRANSFER TECHNIQUE

(75) Inventors: Donald F. Canaperi, Bridgewater, CT (US); Jack Oon Chu, Manhasset Hills, NY (US); Christopher P. D'Emic, Ossining, NY (US); Lijuan Huang, Tarrytown, NY (US); John Albrecht Ott, Greenwood Lake, NY (US); Hon-Sum Philip Wong, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/675,840

(22) Filed: Sep. 29, 2000

(51) Int. Cl.⁷ .................................................. H01L 21/36
(52) U.S. Cl. ....................... 438/478; 438/458; 438/507; 438/479
(58) Field of Search ................................. 438/780, 761, 438/763, 767, 796, 483, 485, 503, 507, 478, 455, 458, 459, 518, 479, 509

(56) References Cited

U.S. PATENT DOCUMENTS 6,107,653 A * 8/2000 Fitzgerald .................... 438/493
6,313,016 B1 * 11/2001 Kibbel et al. ................ 438/478
6,323,108 B1 * 11/2001 Kub et al. ................... 438/458

* cited by examiner

Primary Examiner—Caridad Everhart
(74) Attorney, Agent, or Firm—Robert M. Trepp

(57) ABSTRACT

A method for forming strained Si or SiGe on relaxed SiGe on insulator (SGOI) is described incorporating growing epitaxial $Si_{1-y}Ge_y$ layers on a semiconductor substrate, implanting hydrogen into a selected $Si_{1-y}Ge_y$ layer to form a hydrogen-rich defective layer, smoothing surfaces by Chemo-Mechanical Polishing, bonding two substrates together via thermal treatments and separating two substrates at the hydrogen-rich defective layer. The separated substrates may have its upper surface smoothed by CMP for epitaxial deposition of relaxed $Si_{1-y}Ge_y$, and strained $Si_{1-y}Ge_y$ depending upon composition, strained Si, strained SiC, strained Ge, strained GeC, and strained $Si_{1-y}Ge_yC$.

31 Claims, 3 Drawing Sheets

PREPARATION OF STRAINED SI/SIGE ON INSULATOR BY HYDROGEN INDUCED LAYER TRANSFER TECHNIQUE

FIELD OF INVENTION

This invention relates to Si/SiGe layers on an insulator (SGOI) and more particularly to strained Si/SiGe layers on an insulator structure which is useful for fabricating high speed devices such as complementary metal-oxide-semiconductor (CMOS) transistors, modulation-doped field-effect-transistors (MODFETs), high electron mobility transistors (HEMTs) and bipolar transistors.

BACKGROUND OF THE INVENTION

Electron mobility in strained Si/SiGe channels is significantly higher than that in bulk Si. For example, measured values of electron mobility in strained Si at room temperature are about 3000 cm$^2$/Vs as opposed to 400 cm$^2$/Vs in bulk Si. Similarly, hole mobility in strained SiGe with high Ge concentration (60%~80%) reaches up to 800 cm$^2$/Vs, the value of which is about 5 times the hole mobility in bulk Si of 150 cm$^2$/Vs. The use of strained crystalline materials in state-of-the-art Si devices is expected to result in much higher performances, higher operating speeds in particular. Strained Si/SiGe is of particular significance when conventional Si devices continue to scale down to 0.1 $\mu$m regime and start to approach the fundamental limits of unstrained materials.

However, the underlying conducting substrate for MODFETs and bipolar transistors or the interaction of the underlying substrate with the active device regions in CMOS are undesirable features which limit the full performance of high speed devices. To resolve the problem, in Si technology, an insulating layer is usually used to isolate the active device region from the substrate before creating Silicon-On-Insulator (SOI) materials to replace bulk Si material for device fabrication. Available technology to achieve SOI wafers includes Separation by Implanted Oxygen (SIMOX), bonding and etchback Silicon-On-Insulator (BESOI), separation by implanted hydrogen also known as the Smart-Cut® process which is described in U.S. Pat. No. 5,374,564 by M. Bruel which issued Dec. 20, 1994, or the combination of the last two processes for making ultra-thin SOI, U.S. Pat. No. 5,882,987 by K. V. Srikrishnan which issued Mar. 16, 1999.

When Si is substituted by strained Si/SiGe layers for high speed applications, there is a need for techniques capable of providing SiGe on insulator substrates or wafers for the fabrication of strained Si/SiGe on insulator materials. In U.S. Pat. No. 5,906,951 by Chu et al. which issued May 25, 1999, a method of utilizing wafer bonding and backside etching in KOH with a p$^{++}$-doped SiGe etch-stop to form a layer of strained Si/SiGe on a SOI substrate was described. However, the etch-stop layer is heavily doped by boron in the range from 5×10$^{19}$ to 5×10$^2$ atoms/cm$^3$ and therefore there are chances of the boron auto-doping the strained Si/SiGe layers during thermal treatment. Furthermore, the strained Si/SiGe layer may also be subjected to unwanted KOH etching if etching could not stop uniformly at the p$^{++}$ SiGe etchstop layer due to variation of dopants in the p$^{++}$ layer.

Another available technique for making SiGe-On-Insulator is via SIMOX as reported in a publication by T. Mizuno et al. entitled "High Performance Strained-Si p-MOSFETs on SiGe-on-Insulator Substrates Fabricated by SIMOX Technology," IEDM Technical Digest, 99–934, 1999. However, this method has limited applications because the oxygen implantation induces further damage in the relaxed SiGe layer in addition to the existing defects caused by lattice mismatch, which may consequently degrade the quality of the grown strained Si/SiGe. And, the high temperature anneal (>1100° C.) needed to form oxide after the oxygen implantation is detrimental to the strained Si/SiGe layers since Ge tends to diffuse and agglomerate at temperatures above 600° C., this effect becomes more significant when the Ge content is higher than 10%. Furthermore, in this method, the insulator is limited to SiO$_2$ which has lower thermal conductivity compared to other insulators such as Al$_2$O$_3$.

Therefore, there is a need for a method which is capable of fabricating strained Si/SiGe-On-Insulator wafers or substrates with high quality, i.e., low defect density, and which provides the flexibility of integrating different kinds of materials of desired properties to the substrate, and which has a better controllability for the manufacturing purpose.

SUMMARY OF THE INVENTION

In accordance with the present invention, a method for forming a substrate suitable for growing high quality strained Si/SiGe layers on an insulator (SGOI) is described. This approach comprises the steps of selecting a first semiconductor substrate, forming a first expitaxial graded layer of Si$_{1-x}$Ge$_x$, over the first semiconductor substrate, forming a second relaxed Si$_{1-y}$Ge$_y$, layer over the first graded layer, introducing hydrogen into the relaxed Si$_{1-y}$Ge$_y$ layer creating a hydrogen-rich defective layer comprising high density point defects and micro-cracks, the defective layer being within the relaxed Si$_{1-y}$Ge$_y$ layer, smoothing the surface of the relaxed SiGe epitaxial layer, selecting a second substrate having a layer of insulator such as SiO$_2$, Si$_3$N$_4$, Al$_2$O$_3$, or other acceptable or qualified low-k insulating materials, etc, on the second substrate, and having a planarized major surface on the second substrate, bonding the major surface of the first substrate to the major surface of the second substrate including the step of annealing to form a joined substrate pair with an insulator layer therein between, applying thermal treatments to the substrate pair to induce separation at the hydrogen-rich defective layer, the separation occurring to form a first structure containing the first substrate and a second structure containing the second substrate with a relaxed Si$_{1-y}$Ge$_y$ layer on insulator. The invention further includes smoothing the upper surface of the relaxed Si$_{1-y}$Ge$_y$ layer on said second substrate whereby the second structure is suitable for subsequent epitaxial growth of strained Si/SiGe layers for MOSFET, MODFET, HEMT or bipolar transistor device applications.

BRIEF DESCRIPTION OF THE DRAWING

These and other features, objects, and advantages of the present invention will become apparent upon consideration of the following detailed description of the invention when read in conjunction with the drawing in which:

FIG. 3 is a cross section view of the first semiconductor substrate shown in FIG. 2 bonded to a second substrate with an insulator layer therein between.

FIG. 7 is a cross section view of a thin layer of strained Si/SiGe grown on the upper surface of the embodiment shown in FIG. 5 with an optional thin layer of relaxed $Si_{1-y}Ge_y$ therein between.

DETAILED DESCRIPTION OF THE PREFERRED EMBODIMENTS

Figure 1:
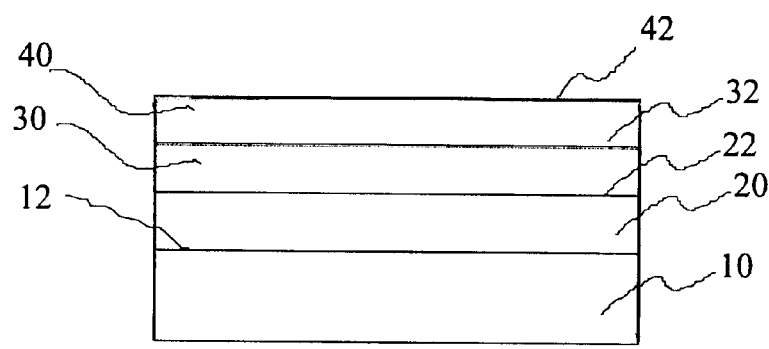
FIG. 1 is a cross section view of a first semiconductor substrate with an epitaxial layer of graded Si$_{1-x}$Ge$_x$ and a relaxed layer of Si$_{1-y}$Ge$_y$ covered with an encapsulation layer.

The drawing illustrates the steps for the production of a thin layer of monocrystalline strained Si or strained SiGe on SiGe on insulator (SGOI) substrates with the aid of planarization of surfaces, wafer bonding and H-induced layer separation and transfer techniques.

Referring now to FIG. 1, a cross section view of a partial embodiment of the invention is shown comprising a substrate 10 and a plurality of layers 20, 30 and 40. Substrate 10 may be a single crystal material such as Si, SiGe, SiGeC, SiC etc. suitable for forming epitaxial layers thereon. An epitaxial graded layer 20 of $Si_{1-x}Ge_x$ is formed on the upper surface 12 of substrate 10. The upper surface 22 of graded layer 20 is substantially relaxed or completely relaxed. The relaxation may be due to a modified Frank-Read mechanism described by LeGoues et al. in U.S. Pat. No. 5,659,187 which issued on Aug. 19, 1997 and is incorporated herein by reference Formation of graded SiGe layer 20 may be formed as described in U.S. Pat. No. 5,659,187 by LeGoues et al. Layer 20 as well as layer 30 (to be described below) may be formed in a UHV CVD process as described in U.S. Pat. No. 5,298,452 by B. S. Meyerson which issued Mar. 29, 1994 and is incorporated herein by reference. In layer 20, the concentration x of Ge may range from zero to a value in the range from 0.2 to 0.5. Layer 20 may have a thickness in the range from about 3,000 angstroms to 1000 nm.

Epitaxial layer 30 is comprised substantially or completely of relaxed $Si_{1-y}Ge_y$ and is formed on upper surface 22 of layer 20. Layer 30 may have a thickness in the range from 200 nm to 1000 nm. The Ge content y in layer 30 is chosen to match 200 nm to 1000 nm. The Ge content y in layer 30 is chosen to match the crystal lattice constant of upper surface 22 of layer 20 such that layer 30 is relaxed or essentially strain free. The Ge content y in layer 30 may be equal to or about the value of x at upper surface 22. The value y may be in the range from about 0.2 to about 0.5. An encapsulation layer 40 may be formed over relaxed layer 30. Encapsulation layer 40 may be deposited via PECVD, LPCVD, UHV CVD or spin-on techniques. The encapsulation material may be, for example, Si, $SiO_2$, Poly Si, $Si_3N_4$, low-k dielectric materials, for example, Diamond Like Carbon (DLC), Fluorinated Diamond Like Carbon (FDLC), a polymer of Si, C, O, and H or a combination of any two or more of the foregoing materials. One example of a polymer of Si, C, O, and H is SiCOH described in Ser. No. 09/107, 567 filed Jun. 29, 1998, now U.S. Pat. No. 6,147,009 issued Nov. 14, 2000, by Grill et al. entitled "Hydrogenated Oxidized Silicon Carbon Material" which is incorporated herein by reference. The deposition temperature for forming layer 40 may be below 900° C. The thickness of the encapsulation layer is in the range from about 5 nm to about 500 nm. Encapsulation layer 40 functions to protect upper surface 32 of layer 30 or to provide an isolation layer.

Figure 2:
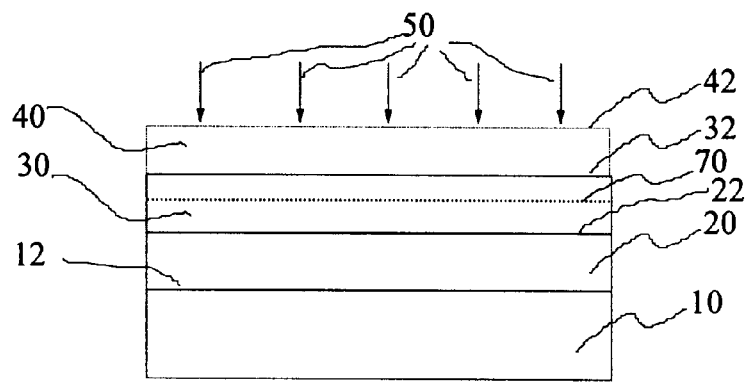
FIG. 2 is a cross section view of the first semiconductor substrate shown in FIG. 1 exposed to an ion bombardment of hydrogen resulting in a H-rich defective layer within the relaxed Si$_{1-y}$Ge$_y$ layer.

FIG. 2 shows substrate 10 from FIG. 1 with SiGe epitaxial layers 20 and 30 and an encapsulation layer 40. Layers 40 and 30 are subjected to ion bombardment or the implantation of hydrogen ions 50. Hydrogen ions 50 may be $H^{30}$ or $H_2+$ and preferably $H_2^+$. $H_2^+$ may be implanted at an energy in the range from about 30 KeV to about 200 KeV at a dose in the range from $3\times10^{16}$ to $1\times10^{17}$ ions/cm². The hydrogen implantation results in the formation of a H-rich layer 70. Layer 70 comprises hydrogen-containing SiGe point defects and planar micro cracks residing in principle crystallographic planes of SiGe. The energy of hydrogen ions 50 is selected to place the peak dose in layer 30 below surface 32 in the range from 100 nm to 1000 nm below surface 32. The hydrogen-rich SiGe layer 70 will form at the peak dose location of hydrogen.

After the step of implanting hydrogen, a second substrate 80 is bonded to layer 40. Prior to wafer bonding, surface 42 of layer 40 is polished by a Chemo-Mechanical Polishing (CMP) process to smooth surface 42 to a planar surface having a root mean square (RMS) in the range from 0.3 nm to 1 nm. Surface 42 may be polished before or after the step of implantation of hydrogen ions 50. Substrate 80 may be a semiconductor such as Si, SiGe, SiGeC or SiC; an insulator such as sapphire, glass or ceramic; or a metal and has an upper surface 90 which may be polished as above to provide a smooth upper surface 90 having a RMS in the range from about 0.3 nm to about 1 nm. The surface roughness or RMS may be determined by performing measurements with an Atomic Force Microscope (AFM) over an area of 20×20 microns.

The top surface 42 of layer 40 shown in FIG. 2 is turned upside down and brought into contact with surface 90 of substrate 80. The two surfaces 42 and 90 are brought together by the wafer bonding approach. Surfaces 42 and 90 are bonded together initially without affecting the integrity of layer 70. Layer 70 shall remain intact mechanically while surfaces 42 and 90 are bonded together by annealing at a temperature in the range from about 20° C. to about 500° C. for a time period in the range from about 2 hours to about 50 hours.

Layer 30 is then separated at layer 70 by annealing at a temperature in the range from 200 ° C. to 600° C. without disturbing the mechanical bond between surface 42 of layer 40 and surface 90 of substrate 80. Layer 30 when separated at layer 70 forms a new upper surface 75 of relaxed $Si_{1-y}Ge_y$ layer 74 which is the upper portion of layer 30, structure 82, after separation shown in FIG. 4. Also surface 73 of relaxed $Si_{1-y}Ge_y$ layer 72 is formed which is the lower portion of layer 30, structure 81, shown in FIG. 4. Layer 74, layer 40 and substrate 80 form SGOI which is structure 82 shown in FIG. 4. The thickness or depth of layer 74 is controlled by the ion bombardment energy such that surface 75 of layer 74 is away from the interface of layers 30 and 20 and therefore contains much less dislocation defects. Surface 75 of $Si_{1-y}Ge_y$ layer 74 with encapsulation layer 40 below may have a surface roughness in the range from about 3 nm to about 15 nm root mean square (RMS). Surface 75 is then smoothed with a Chemo-Mechanical Polishing (CMP) process. The Chemo-Mechanical Polishing (CMP) process may also be needed to thin down the SiGe for some specific applications, e.g., the SiGe may be thinned to a thickness in the range of about 30 nm to about 200 nm for VLSI applications. The surface roughness of surface 75 after CMP is in the range from about 0.3 to about 1 nm RMS.

An example of a smoothing process for surface 75 of $Si_{1-y}Ge_y$ layer 74 by Chemical Mechanical Polishing (CMP) includes a slurry, a 1 psi down force, a 50 rpm of table speed, a 30 to 60 rpm carrier speed and a 0.5 psi backside air pressure. The polishing slurry may be SC112 commercially available from Cabot Corporation, Aurora, Ill. The slurry flow rate may be 140 milliliters/minute. The polishing slurry may have a pH from about 9.5 to about 11.0. The weight % of solids, which contains silica or may be only silica, may be in the range from about 5% to about 30% (a greater range than is in SC112) and the silica particle size may be in the range from about 12 to about 200 nanometers (a greater range than is in SC112). The CMP may be performed in a Westech 372 polishing tool, which comprises a circular rotating polishing platen and a rotating wafer carrier.

The polishing pad system may be a two pad stacked system. The top pad may be product No. IC1000 and the subpad may be product No. Suba IV; both pads are commercially available from Rodel Corporation, Newark, Del. The top pad may be initially conditioned such as using a fixed abrasive (such as diamond) for 300 seconds before polishing. The pad is then conditioned for 25 seconds before each wafer is smoothed.

After the CMP process step, a brush cleaning step is performed. The brush cleaning is effective in removing residual abrasive particles from the wafer surface left from CMP. The brush cleaning step was performed using a conventional double-sided roller brush cleaner containing one stage of brush cleaning. The time duration of the roller brush cleaning step was 99 seconds.

After removing 100–300 nm of surface 75 of $Si_{1-y}Ge_y$ layer 74, the roughness (RMS) of epitaxially grown $Si_{1-y}Ge_y$ layer, where y is 0.15 i.e. 15% Ge, was reduced from 5–6 to 0.5–0.8 nm in Root-Mean-Square (RMS), which is acceptable or qualified for epitaxial growth. With surface 75 of layer 74 smoothed and in condition for epitaxial growth thereon, Si or SiGe may be grown thereon by UHV CVD. Depending on the composition of the grown SiGe and the existing SiGe of layer 74, strained Si or SiGe is formed due to lattice mismatch determined by the difference in compositions.

Smoothing or planarization of SiGe for epitaxial growth has been shown in U.S. Pat. No. 6,107,653 by E. A. Fitzgerald in an epitaxial growth application on bulk silicon. In U.S. Pat. No. 6,107,653, chemo-mechanical polishing (CMP) of the upper surface of a graded SiGe layer was performed to remove the roughness created by dislocations introduced during relaxation of the SiGe layer. The planarization of the surface was for the purpose of preventing the continued roughening and grooving of the surface that leads to dislocation blocking. Planarization prevented a rise in the threading dislocation density during subsequent growth of the graded SiGe layer.

For a further description of CMP of SiGe and other materials to reduce surface roughness to below 1 nm RMS, reference is made to Ser. No. 09/675,841 by D. F. Canaperi et al. filed on even date of Sep. 29, 2000 entitled "A Method of Wafer Smoothing for Bonding Using Chemo-Mechanical Polishing (CMP)" which is assigned to the assignee herein and incoroporated herein by reference.

For a description of forming strained Si/SiGe for high speed CMOS devices reference is made to U.S. Pat. No. 5,534,713 by Ismail et al. which issued on Jul. 9, 1996, U.S. Ser. No. 09/267,323 by Chu et al. (Docket YOR9-1999-0460US1) filed Mar. 12, 1999 which is assigned to the assignee herein and incorporated herein by reference and PCT Application No. US00/06258 by J. O. Chu (Docket YOR9-1999-0123PCT1) having a priority date of Mar. 12, 1999 which is assigned to the assignee herein and incorporated herein by reference.

Figure 5:
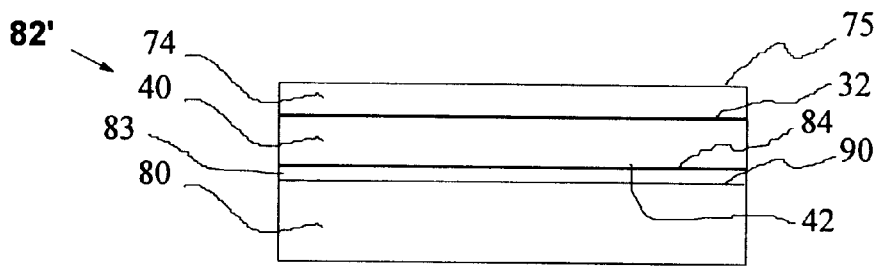
FIG. 5 is a cross section view of a first alternate embodiment of the invention having a smoothed surface of relaxed $Si_{1-y}Ge_y$ after Chemo-Mechanical Polishing (CMP).

In an alternate embodiment, structure 82' includes substrate 80 with an insulator layer 83 between substrate 80 and layer 40 which is shown in FIG. 5. The insulator layer 83 may be deposited or formed via PECVD, LPCVD, UHV CVD, thermal oxidation or spin-on techniques. Insulator layer 83 may comprise a material selected from the group consisting of $SiO_2$, $Si_3N_4$, $Al_2O_3$, or other acceptable or qualified low-k dielectric materials, for example, Diamond Like Carbon (DLC), Fluorinated Diamond Like Carbon (FDLC), a polymer of Si, C, O, and H such as SiCOH or a combination of any two or more of the foregoing materials. The deposition temperature is below 900° C.

Insulator layer 83 may have an upper surface 84 which is polished via CMP in place of or in addition to surface 90 and may be bonded to upper surface 42 of layer 40. If insulator layer 40 is not present over relaxed $Si_{1-y}Ge_y$ layer 30 which after separation is layer 74, insulator layer 83 may be bonded directly to upper surface 32 of layer 74. The bonding steps for bonding insulator layer 83 to insulator layer 40 include annealing at a temperature in the range from about 20° C. to about 500° C. and for a time period in the range from about 2 hours to about 50 hours. The bonding steps for bonding insulator layer 83 to relaxed $Si_{1-y}Ge_y$ layer 30 include annealing at a temperature in the range from about 20° C. to about 500° C. and for a time period in the range from about 2 hours to about 50 hours.

Figure 6:
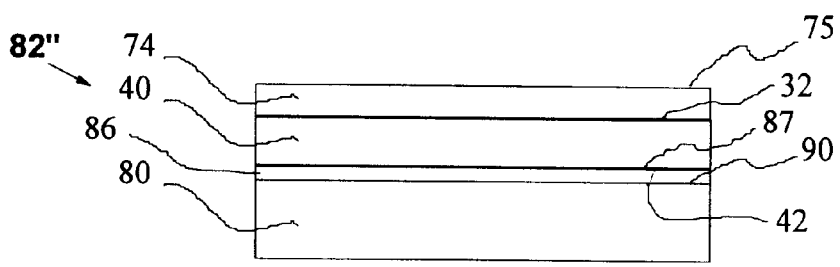
FIG. 6 is a cross section view of a second alternate embodiment of the invention having a smoothed surface of relaxed $Si_{1-y}Ge_y$ after Chemo-Mechanical Polishing (CMP).

In another embodiment, structure 82" includes intermediate layer 86 formed with or in place of insulator layer 83. FIG. 6 shows layer 86 in place of layer 83 shown in FIG. 5. Layer 86 has an upper surface 87 bonded to surface 42 of layer 40. Intermediate layer 86 may be Ge, or metals which either have a low-melting point or react with silicon to form a silicide such as tungsten (W) or cobalt (Co) to achieve high bonding strength at anneal temperatures in the range from about 100° C. to about 800° C. The anneal can be either a furnace anneal or a rapid thermal anneal (RTA). Depending on the selection of intermediate layer 86, the bonding interface can be between SiGe layer 74 and Ge or a metal or between the encapsulation layer 40 and Ge or a metal.

Figure 4:
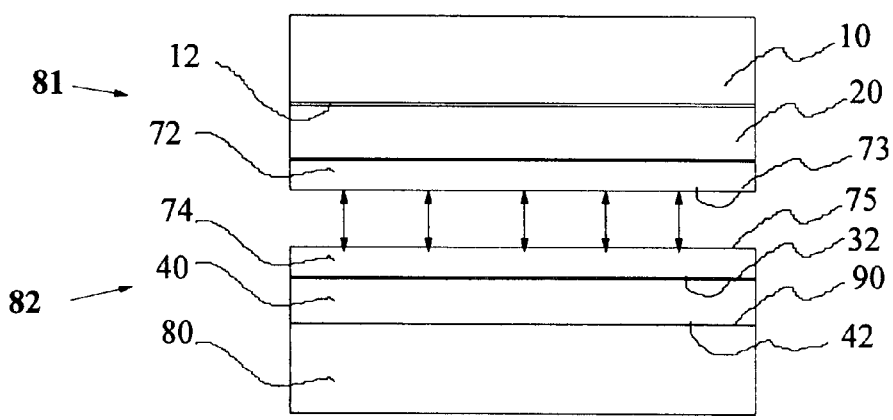
FIG. 4 is a cross section view of separation at the H-rich defective layer within the relaxed $Si_{1-y}Ge_y$ layer during heat treatments, resulting in transfer of a thin layer of relaxed $Si_{1-y}Ge_y$ or a plurality of layers containing the relaxed $Si_{1-y}Ge_y$ and the insulator layer from the first semiconductor substrate on to the second substrate shown in FIG. 3.
Figure 7:
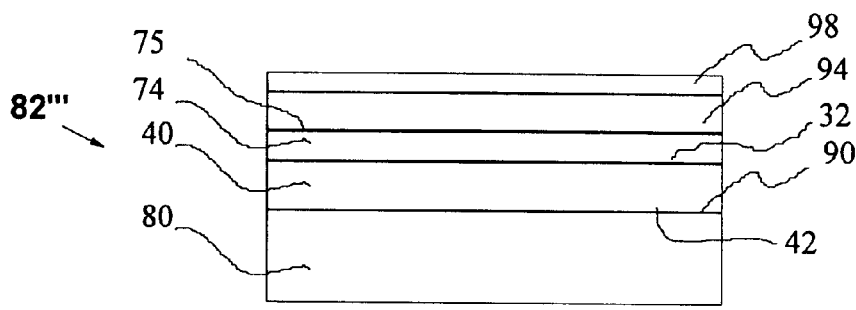

FIG. 7 shows a cross section view of structure 82''' including structure 82 shown in FIG. 4 with epitaxial layers 94 and 98 formed on upper surface 75 of layer 74. Layer 94 may be a thin layer in the range from about 30 nm to about 500 nm of relaxed epitaxial $Si_{1-y}Ge_y$ and layer 98 may be a thin layer in the range from about 100 angstroms to about 300 angstroms of strained Si. Field effect transistors for CMOS or MODFET's may be formed in strained Si layer 98. The strain in Si will be tensile and the mobility of holes and electrons will be increased due to the tensile strain.

Figure 3:
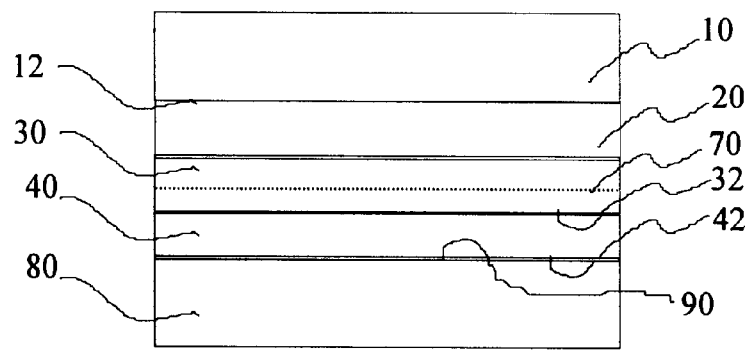
Figure 8:
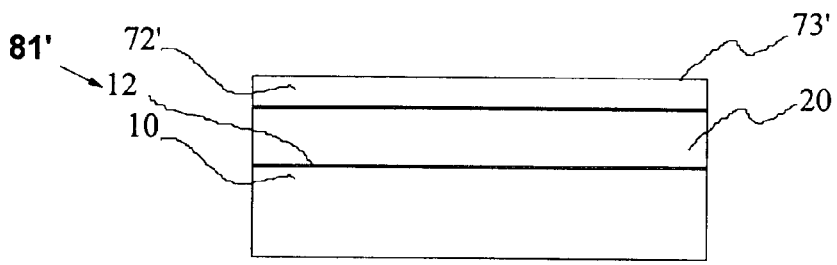
FIG. 8 is a cross section view of a smoothed surface of the relaxed $Si_{1-y}Ge_y$ remaining on the first substrate after Chemo-Mechanical Polishing (CMP).

FIG. 8 shows a cross section view of structure 81' shown in FIG. 4 with upper surface 73' smoothed after Chemo-Mechanical Polishing (CMP) to provide a relaxed $Si_{1-y}Ge_y$ surface suitable for epitaxial deposition of additional $Si_{1-y}Ge_y$ to rebuild the thickness of layer 72' back to the thickness of original layer 30 shown in FIG. 1 or to another selected thickness. An additional layer 40 may be formed over surface 73' of layer 72' (not shown) to provide the embodiment shown in FIG. 1 for starting another sequence of steps as shown in FIGS. 2–4. Alternatively, the embodiment shown in FIG. 8 may be used for starting another sequence of steps as shown in FIGS. 2–4.

It should be noted in the drawing that like elements or components are referred to by like and corresponding reference numerals.

While there has been described and illustrated a method for forming strained Si or SiGe on SiGe on insulator (SGOI) using planarization, cleaning, bonding and layer separation by the implantation of hydrogen, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent are:

1. A method of preparing a relaxed SiGe layer on an insulator comprising the steps of:

forming a graded $Si_{1-x}Ge_x$ epitaxial layer on a first single crystalline semiconductor substrate, where the concentration x of Ge has a value in the range from 0.2 to 0.5 at its upper surface, forming a relaxed $Si_{1-y}Ge_y$ epitaxial layer over said graded $Si_{1-x}Ge_x$ layer, where the concentration y of Ge is equal to or about said value x, forming a hydrogen-rich defective layer in said relaxed $Si_{1-y}Ge_y$ layer via hydrogen bombardment, smoothing the surface of said relaxed $Si_{1-y}Ge_y$ epitaxial layer to provide a surface roughness in the range from about 0.3 nm to about 1 nm root mean square (RMS), selecting a second substrate having an insulator layer thereover, said insulator layer having a major surface with a surface roughness in the range from about 0.3 nm to about 1 nm RMS, bonding said top surface of said relaxed $Si_{1-y}Ge_y$ epitaxial layer on said first substrate to the top surface of said insulator layer on said second substrate, said step of bonding including the step of annealing, and separating said relaxed $Si_{1-y}Ge_y$ layer at said hydrogen-rich defective layer to form a first structure containing said first substrate, said graded $Si_{1-x}Ge_x$ layer and a relaxed $Si_{1-y}Ge_y$ layer on the upper surface and a second structure containing said second substrate and said insulator layer with a relaxed $Si_{1-y}Ge_y$ layer on the upper surface whereby said relaxed SiGe layer on an insulator is formed, said step of separating including a plurality of thermal treatment cycles.

2. The method of claim 1 further including the step of smoothing the upper surface of said relaxed $Si_{1-y}Ge_y$ layer on said second substrate whereby additional epitaxial layers may be grown.

3. The method of claim 2 further including the step of growing an epitaxial layer of a material selected from the group consisting of $Si_{1-y}Ge_y$, Si, SiC, Ge, GeC, and $Si_{1-y}Ge_yC$.

4. The method of claim 3 wherein said $Si_{1-y}Ge_y$ material is selected with a value of y less than or greater than x to provide a strained layer.

5. The method of claim 1 wherein a low-defect $Si_{1-y}Ge_y$ layer is defined by a hydrogen-rich defective layer resulting from a hydrogen bombardment into thick as-grown SiGe layers with a high density of dislocations near the SiGe growth interface.

6. The method of claim 1 wherein said low-defect relaxed $Si_{1-y}Ge_y$ layer on said second substrate has a thickness in the range from about 30 nm to about 1000 nm as determined by the hydrogen bombardment energy.

7. The method of claim 1 wherein an encapsulation layer of a material selected from the group consisting of Si, $SiO_2$, Poly Si, and $Si_3N_4$ is formed on the surface of said relaxed SiGe layer of said first substrate.

8. The method of claim 7 wherein said encapsulation layer is formed and annealed at a temperature in the range from about 400° C. to about 900° C.

9. The method of claim 1 wherein said first substrate is selected from the group consisting of Si, SiGe, SiC, GaAs, or InP.

10. The method of claim 1 wherein said step of smoothing further includes the step of Chemo Mechanical Polishing (CMP) to smooth said surface of said relaxed $Si_{1-y}Ge_y$ layer to provide a surface roughness in the range from about 0.3 nm to about 1 nm RMS.

11. The method of claim 1 wherein after said step of forming a relaxed $Si_{1-y}Ge_y$ epitaxial layer further includes the step of forming an encapsulation layer.

12. The method of claim 11 wherein said said step of smoothing further includes the step of Chemo Mechanical Polishing (CMP) to smooth the surface of said encapsulation layer to provide a surface roughness in the range from about 0.3 nm to about 1 nm RMS.

13. The method of claim 1 wherein said insulator layer is formed on said second substrate.

14. The method of claim 13 wherein said insulator layer includes a material selected from the group consisting of $SiO_2$, $Si_3N_4$, $Al_2O_3$, $LiNbO_3$, low-k materials where k is less than 3.2, or the combination of two or more said materials.

15. The method of claim 13 wherein said insulator layer is formed by a process selected from the group consisting of PECVD, LPCVD, UHVCVD, thermal oxidation and spin-on techniques.

16. The method of claim 13 wherein said insulator layer is formed at a temperature in the range from about 400° C. to about 900° C.

17. The method of claim 1 wherein said second substrate is selected from the group consisting of Si, SiGe, SiC, GaAs, InP, sapphire, glass, quartz, $LiNbO_3$, and PLZT.

18. The method of claim 1 wherein said smoothed top surface of said first $Si_{1-y}Ge_y$ relaxed layer on said first substrate is brought into intimate contact with said top surface of an insulator layer on said second substrate.

19. The method of claim 18 wherein an intermediate agent layer selected from the group consisting of Ge, Al, W, Co, and Ti may be used to enhance the bonding interface.

20. The method of claim 1 wherein a low-defect first portion of said relaxed $Si_{1-y}Ge_y$ layer is separated during said thermal treatment cycles from said first substrate said graded $Si_{1-x}Ge_x$ layer and a second portion of said relaxed $Si_{1-y}Ge_y$ layer, leaving said second portion of said relaxed $Si_{1-y}Ge_y$ layer over said graded $Si_{1-x}Ge_x$ layer on said first substrate.

21. The method of claim 1 wherein said thermal treatment cycles form a strong bond at said bonded interface and at the same time induce separation at said H-rich defective layer of said relaxed $Si_{1-y}Ge_y$ layer by an annealing step selected from the group consisting of furnace anneal and rapid thermal anneal (RTA).

22. The method of claim 21 wherein said anneal ambient during said annealing step is selected from the group consisting of air, $N_2$ and Ar.

23. The method of claim 21 wherein said step of annealing includes the step of heating to a temperature in the range from about 100° C. to about 800° C.

24. The method of claim 1 wherein after said step of separating further including the step of smoothing by Chemo-Mechanical Polishing (CMP) the top surface of said relaxed $Si_{1-y}Ge_y$ layer on insulator on said second substrate.

25. The method of claim 24 wherein said step of Chemo-Mechanical Polishing (CMP) includes polishing said top surface of said smoothed relaxed $Si_{1-y}Ge_y$ layer to provide a smoothness in the range from about 0.3 nm to about 1 nm.

26. The method of claim 24 wherein a relaxed $Si_{1-y}Ge_y$ layer may be epitaxially grown on said top surface of said smoothed relaxed $Si_{1-y}Ge_y$ layer.

27. The method of claim 26 wherein said step of epitaxially growing said relaxed $Si_{1-y}Ge_y$ layer includes growing to a thickness in the range from about 30 nm to about 500 nm.

28. The method of claim 24 further including the step of growing one of strained Si or strained SiGe on said smoothed relaxed $Si_{1-y}Ge_y$ layer.

29. The method of claim 26 further including the step of growing one of strained Si or strained SiGe on said smoothed relaxed $Si_{1-y}Ge_y$ layer.

30. The method of claim 1 wherein said relaxed $Si_{1-y}Ge_y$ layer on said first substrate is smoothed by the step of CMP followed by the step of growing a relaxed $Si_{1-y}Ge_y$ layer.

31. The method of claim 30 wherein said first substrate with graded $Si_{1-x}Ge_x$ and relaxed $Si_{1-y}Ge_y$ layers include the step of hydrogen bombardment whereby the the steps of smoothing, selecting, bonding, and separating may be repeated for preparing an additional SiGe layer on an insulator.

* * * * *